United States Patent [19]

Nelson

[11] 4,414,666
[45] Nov. 8, 1983

[54] ERROR CHECKING AND CORRECTING APPARATUS

[75] Inventor: Robert D. Nelson, Sunnyvale, Calif.

[73] Assignee: National Semiconductor Corporation, Santa Clara, Calif.

[21] Appl. No.: 260,158

[22] Filed: Apr. 30, 1981

[51] Int. Cl.³ .............................................. G06F 11/10
[52] U.S. Cl. ......................................... 371/37; 371/39
[58] Field of Search ..................................... 371/37, 39

[56] References Cited

U.S. PATENT DOCUMENTS

| | | | |
|---|---|---|---|
| 3,504,340 | 3/1970 | Allen | 371/37 |
| 3,685,014 | 8/1972 | Hsiao et al. | 371/37 |
| 4,117,458 | 9/1978 | Burghard et al. | 371/37 |
| 4,241,446 | 12/1980 | Trubisky | 371/37 |
| 4,330,860 | 5/1982 | Wada et al. | 371/37 |

Primary Examiner—Charles E. Atkinson
Attorney, Agent, or Firm—Gail W. Woodward; Paul J. Winters; Michael J. Pollock

[57] ABSTRACT

An error checking apparatus and method for detecting a plurality of errors in a digital data word includes means for generating a unique syndrome word for each one of a plurality of error patterns in a word containing up to N−1 bits in error, where N is the number of bits in said word.

5 Claims, 6 Drawing Figures

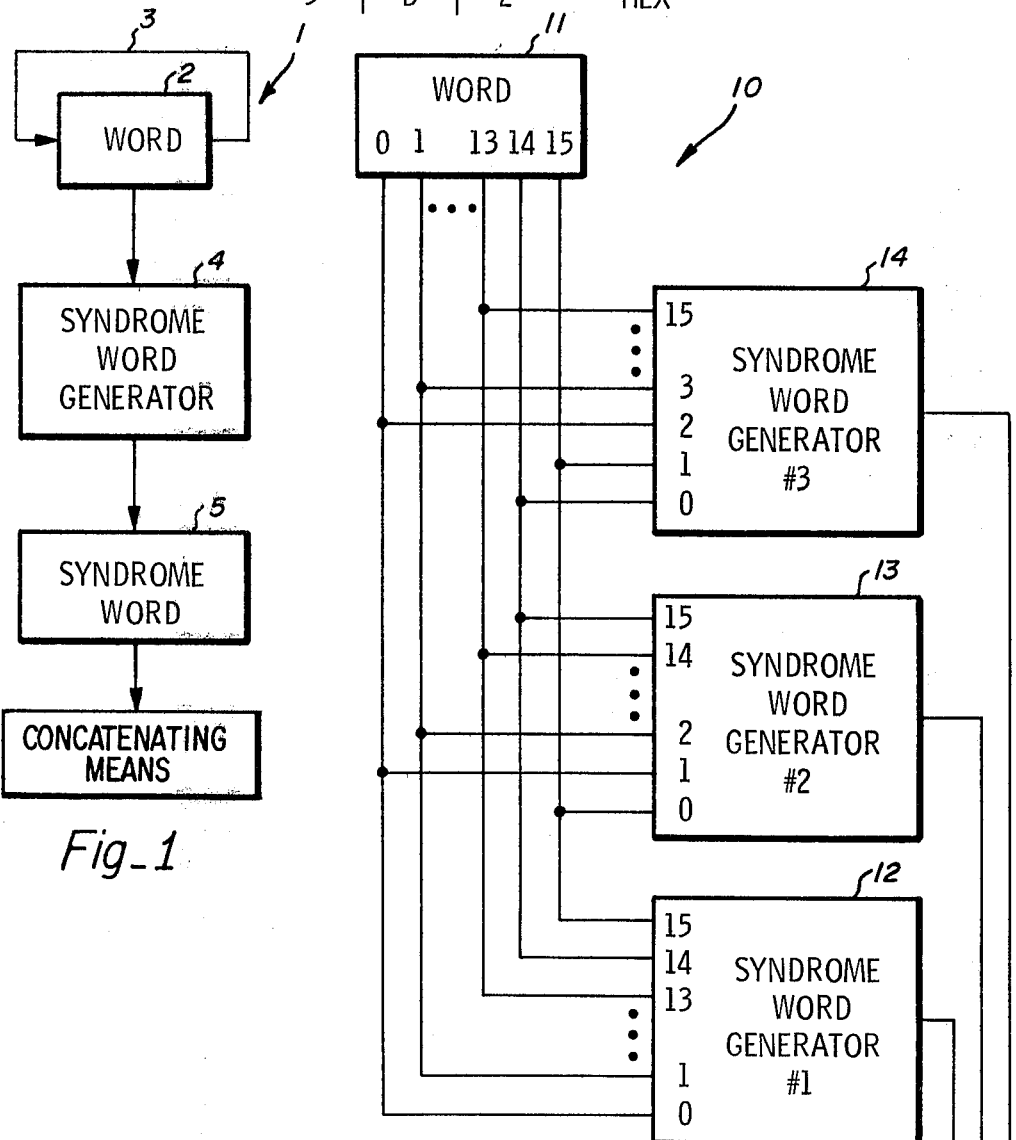# *Fig_5*
*Fig_1*
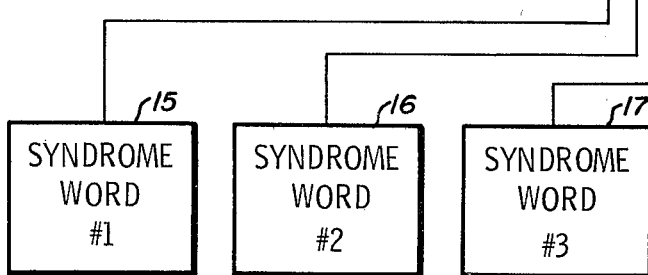
*Fig_6*

```
              *  *
 0  1  2  3  4  5  6  7  8  9 10 11 12 13 14 15

0  0  1  1  1  1  1  0  1  1  1  0  1  1  1     5
 0  0  0  1  0  0  1  0  1  1  0  1  0  1  1  1  4
 1  0  0  1  1  0  0  0  1  0  1  0  1  1  1  1  3
 0  1  1  0  0  0  0  1  1  1  1  0  1  0  1  1  2   Fig_2
 1  1  0  0  0  1  0  1  1  0  0  1  0  1  0  1  1
 1  1  1  0  1  1  1  0  1  0  0  0  1  1  1  0  0
```

2 DATA BIT ERROR DETECT SYNDROME MAP (HEX)..........

| 1 | 2 | 3 | 4 | 5 | 6 | 7 | 8 | 9 | 10 | 11 | 12 | 13 | 14 | 15 | |
|---|---|---|---|---|---|---|---|---|---|---|---|---|---|---|---|
| 0C | 2E | 33 | 22 | 28 | 3A | 2D | 14 | 3F | 27 | 39 | 06 | 30 | 36 | 35 | 0 |
|  | 22 | 3F | 2E | 24 | 36 | 21 | 18 | 33 | 2B | 35 | 0A | 3C | 3A | 39 | 1 |
|  |  | 1D | 0C | 06 | 14 | 03 | 3A | 11 | 09 | 17 | 28 | 1E | 18 | 1B | 2 |
|  |  |  | 11 | 1B | 09 | 1E | 27 | 0C | 14 | 0A | 35 | 03 | 05 | 06 | 3 |
|  |  |  |  | 0A | 18 | 0F | 36 | 1D | 05 | 1B | 24 | 12 | 14 | 17 | 4 |
|  |  |  |  |  | 12 | 05 | 3C | 17 | 0F | 11 | 2E | 18 | 1E | 1D | 5 |
|  |  |  |  |  |  | 17 | 2E | 05 | 1D | 03 | 3C | 0A | 0C | 0F | 6 |
|  |  |  |  |  |  |  | 39 | 12 | 0A | 14 | 2B | 1D | 1B | 18 | 7 |
|  |  |  |  |  |  |  |  | 2B | 33 | 2D | 12 | 24 | 22 | 21 | 8 |
|  |  |  |  |  |  |  |  |  | 18 | 06 | 39 | 0F | 09 | 0A | 9 |
|  |  |  |  |  |  |  |  |  |  | 1E | 21 | 17 | 11 | 12 | 10 |
|  |  |  |  |  |  |  |  |  |  |  | 3F | 09 | 0F | 0C | 11 |
|  |  |  |  |  |  |  |  |  |  |  |  | 36 | 30 | 33 | 12 |
|  |  |  |  |  |  |  |  |  |  |  |  |  | 06 | 05 | 13 |
|  |  |  |  |  |  |  |  |  |  |  |  |  |  | 03 | 14 |

Fig_3

2 DATA BIT ERROR CORRECT SYNDROME MAP (HEX)..........

| 1 | 2 | 3 | 4 | 5 | 6 | 7 | 8 | 9 | 10 | 11 | 12 | 13 | 14 | 15 | |
|---|---|---|---|---|---|---|---|---|---|---|---|---|---|---|---|
| 88C | FEE | BB3 | 922 | DA8 | 87A | 62D | CD4 | AFF | D67 | 2B9 | F06 | EB0 | E76 | 335 | 0 |
|  | 762 | 33F | 1AE | 524 | 0F6 | EA1 | 458 | 273 | 5EB | A35 | 78A | 63C | 6FA | BB9 | 1 |
|  |  | 45D | 6CC | 246 | 794 | 9C3 | 33A | 511 | 289 | D57 | 0E8 | 15E | 198 | CDB | 2 |
|  |  |  | 291 | 61B | 3C9 | D9E | 767 | 14C | 6D4 | 90A | 4B5 | 503 | 5C5 | 886 | 3 |
|  |  |  |  | 48A | 158 | F0F | 5F6 | 3DD | 445 | B9B | 624 | 792 | 754 | A17 | 4 |
|  |  |  |  |  | 5D2 | B85 | 17C | 757 | 0CF | F11 | 2AE | 318 | 3DE | E9D | 5 |
|  |  |  |  |  |  | E57 | 4AE | 285 | 51D | AC3 | 77C | 6CA | 60C | B4F | 6 |
|  |  |  |  |  |  |  | AF9 | CD2 | B4A | 494 | 92B | 89D | 85B | 518 | 7 |
|  |  |  |  |  |  |  |  | 62B | 1B3 | E6D | 3D2 | 264 | 2A2 | FE1 | 8 |
|  |  |  |  |  |  |  |  |  | 798 | B46 | 5F9 | 44F | 489 | 9CA | 9 |
|  |  |  |  |  |  |  |  |  |  | FDE | 261 | 3D7 | 311 | E52 | 10 |
|  |  |  |  |  |  |  |  |  |  |  | DBF | C09 | CCF | 18C | 11 |
|  |  |  |  |  |  |  |  |  |  |  |  | 1B6 | 170 | C33 | 12 |
|  |  |  |  |  |  |  |  |  |  |  |  |  | 0C6 | D85 | 13 |
|  |  |  |  |  |  |  |  |  |  |  |  |  |  | D43 | 14 |

Fig_4

ERROR CHECKING AND CORRECTING APPARATUS

BACKGROUND OF THE INVENTION

The present invention relates to error checking and correcting apparatus in general and, in particular, to error checking and correcting (ECC) apparatus for detecting and correcting a plurality of errors in a digital data word.

At the present time there are apparatus and methods for detecting and correcting up to two errors in a data word. To correct up to two errors in a data word, it has been the practice to provide in prior known ECC apparatus and methods syndrome word generating apparatus for generating an array of syndrome words. As distinguished from data dependent check bits, which are generated using odd and even parity techniques, syndrome words are error dependent. Consequently, when considering ECC apparatus and methods it has become conventional and convenient to consider error patterns in the data word instead of the data bits.

Considering a given error pattern in a data word with respect to any prior known array of syndrome words, it will be recognized that there is a unique syndrome word associated with each bit location in error in the data word. Heretofore, however, prior known arrays of snydrome words used for detecting and correcting a one bit error could not be used for correcting more than a one bit error in a given data word. It is, of course, highly desirable to be able to detect and correct more than one error in a given data word in certain applications. This is particularly true at the present time as technology increases the length of data fields. For a more detailed discussion of prior known ECC methods and apparatus, reference may be made to the book, Error Correcting Codes by Peterson and Weldon.

SUMMARY OF THE INVENTION

In view of the foregoing, a principal object of the present invention is a method and apparatus for digital error checking and correcting comprising means for generating a unique syndrome word for each one of a plurality of possible error patterns in a word containing up to N−1 bits in error, where N is the number of bits in said word.

Another object of the present invention is an apparatus and method as described above wherein said unique syndrome word comprises M(n+2) bits where M is the number of possible errors in said word and n=log₂(N).

Another object of the present invention is an apparatus and method as described above comprising means for storing a data word and wherein said unique syndrome word generating means comprises: means for generating a first syndrome word corresponding to the location of the bits in error in said data word; means for changing the relative significance of the bits in said data word after said generating of said first syndrome word; means for generating a succeeding syndrome word corresponding to the bits in error in said data word after each such change in significance; and means for combining said first and said succeeding syndrome words in a predetermined manner.

Another object of the present invention is an apparatus and method as described above wherein said combining of said first and said succeeding syndrome words in a predetermined manner comprises means for concatenating said first and said succeeding syndrome words.

A principal feature of the apparatus and method of the present invention is a syndrome word code generator comprising a plurality of logic elements interconnected to form a matrix of syndrome words. In a well known manner, the matrix comprises or corresponds to a plurality of unique rows and columns of bits. Each of the unique columns contains an odd number of binary ones greater than one. As thus described, the Code generated by this matrix may be recognized as a modified Hamming code. However, it differs from the conventional modified Hamming code in that it comprises a unique array of bits which, when used with a data word in the manner to be described briefly above and in detail below, permits the detection and correction of errors in more than two bit locations simply, reliably and inexpensively.

BRIEF DESCRIPTION OF THE DRAWING

The above and other objects, features, and advantages of the present invention will become apparent from the following detailed description of the accompanying drawing in which FIG. 1 is a block diagram of an embodiment of the present invention.

FIG. 2 is an array of syndrome words for a 16 bit data field according to the present invention.

FIG. 3 is a two data bit error detect syndrome map in hexadecimal notation where the letters A, B, C, D, E, and F correspond to the binary equivalent of the decimal numbers 10, 11, 12, 13, 14, and 15.

FIG. 4 is a two data bit error correct syndrome map in the above described hexadecimal notation.

FIG. 5 is a diagram of an example of syndrome words associated with errors in data bit locations 5 and 6 of a sample word in error.

FIG. 6 is a block diagram of an alternative embodiment of the present invention.

DETAILED DESCRIPTION OF THE DRAWING

Referring to FIG. 1, there is provided in accordance with the present invention an error checking and correcting (ECC) apparatus designated generally as 1. In apparatus 1 there is provided a recirculating word register 2. Word register 2 is a conventional shift register with a line 3 connecting opposite ends of the register 2 for recirculating the contents of the register. Coupled to the word register 2 there is provided a syndrome word generator 4. Coupled to the syndrome word generator 4 there is provided a syndrome word register 5. In the syndrome word generator 4 there is provided a plurality of logic elements interconnected in a conventional manner to form a matrix for generating a code corresponding to the array shown in FIG. 2.

Referring to FIG. 2, there is shown an array of bits comprising a plurality of unique columns of binary ones and zeros. Each of the columns of ones and zeros contains an odd number of ones greater than one. The number of columns corresponds to the number of bits N in a data word. The number of rows in the array equals n+2 where n=log₂(N).

The array of FIG. 2 will be recognized as a modified Hamming code which is usable in a conventional manner for conventional error checking and correction of a one bit error and which, when so used, obeys conventional rules for error checking and correction of a one bit error. For example, all zeros in a syndrome word indicates that there are no errors in either the data bit field or the check bit field of a word being checked. A binary one in the syndrome word indicates and locates a one bit error in the check bit field. An odd number of ones greater than one indicates and locates a one bit error in the data field. An even number of ones in the syndrome word greater than zero indicates that there are either two errors in the check bit field, two errors in the data bit field or one error in each of the data bit and error bit fields, but does not identify the location of the two errors.

The invention will now be described using as an example a 16 bit word in which there are assumed to be two errors located at bit locations of 5 and 6.

Referring to FIG. 2, it is assumed that a 16 bit word as described above is stored in a memory. Subsequently, the word is retrieved from the memory and stored in the word register 2, but, that upon its retrieval, two bits are in error, namely the bits in bit locations 5 and 6, as indicated by asterisks in the FIG. 2. With errors in bit locations 5 and 6, the syndrome word generator 4, using logic elements for generating a modified Hamming code corresponding to the array of FIG. 2, generates in a conventional manner a first syndrome word comprising the bits of the array associated with bit location 5 and a second syndrome word comprising the bits of the array associated with bit location 6. Reading left to right, most significant bit first, the first syndrome word (a) comprises bits 100011. Similarly, the second syndrome word (b) comprises bits 110001. As seen in FIG. 2, the most significant bits in the array are in the top row, or row 5, and the least significant bits in the array are in the bottom row, or row 0.

After the first and second syndrome words (a) and (b) are generated, the significance of the bits in error in the word in the word register is changed by rotating the word one bit position to the right, as indicated by the arrow at the end of the line 3 extending from the word register 2 of FIG. 1. This places the assumed errors in bit locations 6 and 7. After the word in the word register 2 is rotated one bit position to the right, a third and a fourth syndrome word (c) and (d) are generated, comprising the bits of the array associated with bit locations 6 and 7. Reading from FIG. 2, the third syndrome word (c) is 110001 and the fourth syndrome word (d) is 100110.

Referring to FIG. 5, after the first, second, third and fourth syndrome words, (a), (b), (c) and (d), are generated, the first and second syndrome words, (a) and (b), are exclusively OR'd using even parity techniques for generating a syndrome word A comprising the bits 010010 or hexidecimal 12. The third and fourth syndrome words, (c) and (d), are exclusively OR'd using even parity techniques for generating a syndrome word B comprising the bits 010111 or hexidecimal 17. As described above, hexidecimal numbers A, B, C, D, E, and F correspond to the binary equivalents of decimal numbers 10, 11, 12, 13, 14, and 15 respectively.

As will become apparent from the following discussion of FIG. 3, hex 12 and 17 uniquely identify the locations 5 and 6 of the assumed errors in the 16 bit word example.

Referring to FIG. 3, it will be seen that hex 12 appears at the intersection of the ordinate 6 and abscissa 5 thereby identifying that the bits at bit locations 5 and 6 are possibly in error. Hex 12, however, also appears at other intersections. See, for example, the intersection of the ordinate 9 and abscissa 7 and the ordinate 12 and abscissa 8. To resolve the ambiguity, the syndrome word B or hex 17 is used with hex 12.

Looking for hex 17 to the right of and below hex 12, as would be expected because of the one bit shift to the right of the errors in generating hex 17, it can be seen that the only place that hex 17 appears immediately adjacent to and below hex 12 is at the intersection of the ordinate 7 and abscissa 6.

Using the techniques described above, it can be readily shown that the above unique circumstance is repeatable for every one and two bits errors in a 16 bit word using the array of FIG. 2 and the even parity techniques described.

The uniqueness of the combination of syndrome words A and B described above with respect to FIG. 3 may be further used to advantage to avoid the necessity of "looking up" two hex numbers.

Referring to FIG. 4, by concatenating the syndrome words A and B and forming the hexidecimal equivalents thereof and comparing the result with the numbers in the table of FIG. 4, the location of the errors in the 16 bit word can be determined directly. For example, the concatenation of syndrome words A and B results in a unique syndrome word comprising the bits 010111010010, where B comprises 010111 and A comprises 010010. As seen in FIG. 5, the hexidecimal equivalent will be seen to be 5D2. As seen in FIG. 4, the number 5D2 appears uniquely at the intersection of the ordinate 6 and abscissa 5 thereby uniquely identifying the location of the bit errors in the assumed example.

Referring to FIG. 6, there is provided, in an alternative embodiment to the present invention, a digital error checking and correcting apparatus designated generally as 10. In the apparatus 10 there is provided a word register 11 and a plurality of syndrome word generators 12, 13, and 14. Word register 11 is provided for receiving and storing a 16 bit data word. The 16 bit data word is stored in register stages designated 0-15. Each of the syndrome word generators 12, 13, and 14 have a plurality of inputs designated 0-15. Each of the word register stages 0-15 is coupled to a different one of the inputs 0-15 of all of the syndrome word generators 12-14. For example, stage 0 is coupled to input 0 of syndrome word 12, input 1 of syndrome word 13, and input 2 of syndrome word generator 14. Stage 1 is coupled to stage 1 of syndrome word generator 12, input 2 of syndrome word generator 13, and input 3 of syndrome word generator 14, and so on; so that, in effect, each of the syndrome word generators 12, 13, and 14 will receive the word in word register 11 as if it were shifted one bit position to the right.

Coupled to the output of the syndrome word generators 12, 13, and 14, there is provided a plurality of syndrome word registers 15, 16, and 17, respectively. Registers 15, 16, and 17 are provided for receiving the syndrome word generated by each of the syndrome word generators 12, 13, and 14 in response to errors in a word in the word register 11, as described above with respect to the apparatus of FIG. 1.

In operation, the generation of syndrome words in each of the syndrome word generators 12-14 of FIG. 6 is identical to the generation of syndrome words in the apparatus of FIG. 1. However, by utilizing a plurality of syndrome word generators, the time required for producing a plurality of syndrome words to detect a plurality of potential bit errors is reduced. In fact, the time it takes to detect and locate a plurality of bit errors with the apparatus of FIG. 6 is approximately the same as the time it takes to detect and locate one data bit error with the apparatus of FIG. 1. This is because no time is required to shift the word in order to change the significance of its bits in error as in the apparatus of FIG. 1.

Though two embodiments of the present invention are disclosed and described, it is contemplated that other embodiments will be apparent and may be made without departing from the spirit and scope of the present invention. For example, no specific arrangement of logic elements in the syndrome word generators 4, 12, 13 and 14 is disclosed simply because a plurality of them is possible and all are conventional in terms of their construction given the array of FIG. 2. Accordingly, it is intended that the scope of the present invention not be determined by reference to the embodiments described, but rather be determined solely by reference to the claims hereinafter provided and their equivalents.

What is claimed is:

1. A digital error detecting apparatus comprising means for storing a data word containing up to $N-1$ bits in error where N is the number of bits in said data word; and means responsive to said means for storing said data word for generating a unique syndrome word for each one of a plurality of possible error patterns in said data word, wherein said unique syndrome word generating means comprises:

means for generating a first syndrome word corresponding to the location of bits in error in said data word;

means for changing the relative significance of the bits in said data word after said generating of said first syndrome word;

means for generating a succeeding syndrome word corresponding to the bits in error in said data word after each such change in significance; and means for combining said first and second succeeding syndrome words in a predetermined manner.

2. An apparatus according to claim 1 wherein said combining means comprises means for concatenating said first and said succeeding syndrome words.

3. A method of detecting errors in the bits of a data word containing up to $N-1$ bits in error where N is the number of bits in said data word comprising the steps of generating a unique syndrome word for each one of a plurality of possible error patterns in said data word, wherein said generating step comprises the steps of:

generating a first syndrome word corresponding to the location of the bits in error in said data word;

changing the relative significance of the bits in said data word;

generating a succeeding syndrome word corresponding to the bits in error in said data word after each such change in significance; and combining said first and second succeeding syndrome words in a predetermined manner.

4. A method according to claim 3 wherein said combining step comprises the step of concatenating said first and said succeeding syndrome words.

5. A method according to claim 3 wherein said significance changing step comprises the step of rotating said data word.

* * * * *